(12) United States Patent
Vanwiggeren et al.

(10) Patent No.: US 11,867,832 B2
(45) Date of Patent: Jan. 9, 2024

(54) SEPARATING RECEIVE AND TRANSMIT ANTENNAS OF A RADAR TEST SYSTEM

(71) Applicant: Keysight Technologies, Inc., Santa Rosa, CA (US)

(72) Inventors: Gregory Douglas Vanwiggeren, San Jose, CA (US); Todd Steven Marshall, Los Gatos, CA (US); Gregory S. Lee, Mountain View, CA (US); Natalie Killeen, Sebastopol, CA (US); Christian Bourde, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 294 days.

(21) Appl. No.: 17/175,761

(22) Filed: Feb. 15, 2021

(65) Prior Publication Data
US 2022/0260674 A1   Aug. 18, 2022

(51) Int. Cl.
*G01S 7/40* (2006.01)
*G01R 31/00* (2006.01)
*H01Q 1/52* (2006.01)

(52) U.S. Cl.
CPC .......... *G01S 7/4052* (2013.01); *G01R 31/002* (2013.01); *G01S 7/4008* (2013.01); *H01Q 1/525* (2013.01); *G01S 7/4086* (2021.05)

(58) Field of Classification Search
CPC .... G01S 7/4052; G01S 7/4008; G01S 7/4086; G01S 13/931; G01S 7/032; G01R 31/002; H01Q 1/525; H01Q 9/0407; H01Q 17/00
See application file for complete search history.

(56) References Cited

U.S. PATENT DOCUMENTS

| | | | |
|---|---|---|---|
| 4,613,863 A | 9/1986 | Mitchell |
| 4,660,041 A | 4/1987 | Maples et al. |
| 4,686,534 A | 8/1987 | Eddy |
| 4,737,792 A | 4/1988 | Grone |
| 5,117,230 A | 5/1992 | Wedel, Jr. |
| 5,177,488 A | 1/1993 | Wang et al. |
| 5,247,843 A | 9/1993 | Bryan |
| 5,431,568 A | 7/1995 | Fey et al. |
| 5,457,463 A | 10/1995 | Vencel et al. |

(Continued)

FOREIGN PATENT DOCUMENTS

| | | |
|---|---|---|
| CN | 102928824 B | 1/2014 |
| CN | 204101724 U | 1/2015 |

(Continued)

OTHER PUBLICATIONS

Disclosure of 20200237 dated Aug. 25, 2020, 7 pgs.

(Continued)

*Primary Examiner* — Donald H B Braswell (57) ABSTRACT

A miniature radar target simulator (MRTS) and a system comprising a plurality of MRTS's are described. The MRTS and system are useful for emulating echo signals for a radar DUT with reduced interference. Illustrative radar test systems desirably generate the intended (emulated) radar targets and reduce unwanted ("ghost") signals, which can result in "ghost targets," and errant/ambient electromagnetic radiation that reduces the performance and reliability of known re-illuminators and systems including same.

18 Claims, 7 Drawing Sheets

(56) References Cited

U.S. PATENT DOCUMENTS

| | | | |
|---|---|---|---|
| 5,528,522 A | 6/1996 | Delguerico | |
| 5,892,479 A * | 4/1999 | Mills | G01S 7/4052 |
| | | | 342/170 |
| 6,067,041 A | 5/2000 | Kaiser et al. | |
| 6,075,480 A | 6/2000 | Deliberis, Jr. | |
| 6,114,985 A | 9/2000 | Russell et al. | |
| 6,218,989 B1 | 4/2001 | Schneider et al. | |
| 6,297,764 B1 * | 10/2001 | Wormington | G01S 7/4021 |
| | | | 342/99 |
| 6,384,771 B1 | 5/2002 | Montague et al. | |
| 6,496,139 B1 | 12/2002 | Flacke et al. | |
| 6,803,877 B2 | 10/2004 | Ludewig et al. | |
| 7,145,504 B1 | 12/2006 | Newberg et al. | |
| 8,334,803 B1 | 12/2012 | Urkowitz | |
| 9,151,828 B2 | 10/2015 | Shipley | |
| 9,581,683 B2 | 2/2017 | Choi | |
| 10,509,107 B2 | 12/2019 | Heuel et al. | |
| 10,527,715 B2 | 1/2020 | Ahmed et al. | |
| 11,415,668 B2 | 8/2022 | Gruber et al. | |
| 11,486,963 B2 | 11/2022 | Kong | |
| 11,520,008 B2 | 12/2022 | Lee | |
| 11,543,489 B2 | 1/2023 | Lee | |
| 2006/0267832 A1 | 11/2006 | Newberg et al. | |
| 2008/0018525 A1 | 1/2008 | Svy et al. | |
| 2008/0088501 A1 * | 4/2008 | Chandler | G01S 7/4052 |
| | | | 342/51 |
| 2015/0219752 A1 | 8/2015 | Lewis et al. | |
| 2015/0364829 A1 * | 12/2015 | Tong | H01Q 23/00 |
| | | | 343/834 |
| 2015/0369905 A1 | 12/2015 | Shipley | |
| 2017/0010347 A1 | 1/2017 | Schutte et al. | |
| 2017/0115378 A1 | 4/2017 | Haghighi et al. | |
| 2017/0270376 A1 | 9/2017 | Aina | |
| 2019/0041496 A1 | 2/2019 | Salvesen et al. | |
| 2019/0391234 A1 | 12/2019 | Gruber et al. | |
| 2020/0019160 A1 | 1/2020 | McArthur et al. | |
| 2020/0110156 A1 * | 4/2020 | Ahmed | G01S 7/4095 |
| 2021/0055384 A1 | 2/2021 | Lee | |
| 2021/0373122 A1 | 12/2021 | Hamberger et al. | |
| 2022/0021120 A1 * | 1/2022 | Montoya | G01S 13/74 |

FOREIGN PATENT DOCUMENTS

| | | |
|---|---|---|
| CN | 109459733 A | 3/2019 |
| CN | 112630733 A1 | 4/2021 |
| CN | 114258498 A | 3/2022 |
| DE | 102007002370 A1 | 7/2008 |
| DE | 102020212593 A1 | 4/2021 |
| JP | H07174840 A | 7/1995 |
| JP | 2001044748 A | 2/2001 |
| JP | 2005094440 A | 4/2005 |
| JP | 2008098919 A | 4/2008 |
| JP | 6264316 B2 | 1/2018 |
| JP | 2022018108 A | 1/2022 |
| KR | 10-2011-0069246 A | 6/2017 |
| KR | 10-2017-0103263 A | 9/2017 |
| WO | 2019/068126 A | 4/2019 |
| WO | 2021034357 A1 | 2/2021 |

OTHER PUBLICATIONS

George E. Ponchak et al., "The Use of Metal Filled Via Holes for Improving Isolation in LTCC RF and Wireless Multichip Packages", IEEE Transactions on Advanced Packaging, vol. 23, No. 1, Feb. 2000, pp. 88-99.

David M. Pozar, "Considerations for Millimeter Wave Printed Antennas", IEEE Transactions on Antennas and Propagation, vol. AP-31, No. 5, Sep. 1983, pp. 740-747.

Werner Scheiblhofer et al.,"A Low-Cost Multi-Target Simulator for FMCW Radar System Calibration and Testing", Proceedings of the 47th European Microwave Conference, Oct. 10-12, 2017, Nuremberg, Germany, pp. 1191-1194.

"Direct Reading Radar Target Simulator", STR-773-12-D1, Eravant, Savage Millimeter, Inc., 2018, https://www.eravant.com/76-5-ghz-wr-12-dc-to-250-mhz-i-qfreq-30-db-carrier-rej-direct-reading-radar-target-simulator, pp. 1-2.

Kun Wei et al, "S-shaped periodic defected ground structures to reduce microstrip antenna array mutual coupling", Electronics Letters, Jul. 21, 2016, vol. 52, No. 15, pp. 1288-1290.

Fan Yang et al., "Microstrip Antennas Integrated With Electromagnetic Band-Gap (EBG) Structures: A Low Mutual Coupling Design for Array Applications", IEEE Transactions on Antennas and Propagation, vol. 51, No. 10, Oct. 2003, pp. 2936-2946.

Hussein Attia et al., "60 GHz PRGW Slot Antenna Array with Small Separation and Low Mutual Coupling", IEEE Global Symposium on Millimeter-Waves (GSMM), 2015, pp. 1-3.

English translation of CN102928824B, dated Jan. 8, 2014, 7 pgs.

Michael Ernst Gadringer et al., "Radar target stimulation for automotive applications", IET Radar, Sonar, and Navigation, vol. 12, issue 10, 2018, pp. 1-8.

David B. Rutledge et al, "Performance of a 100-element HBT grid amplifier", IEEE Transactions on Microwave Theory and Techniques, vol. 41, No. 10, Oct. 1993, pp. 1762-1771.

Werner Scheiblhofer et al.,"A Low-Cost Multi-Target Simulator for FMCW Radar System Calibration and Testing" Proceedings of the 14th European Radar Conference, Oct. 11-13, 2017, Germany p. 343-346.

D Meena et al., "Design of Multilevel Radar Target Simulator," 2007 IEEE Radar Conference, pp. 203-208.

International Search Report and Written Opinion for PCT Application No. PCT/US2020/031588 dated Aug. 21, 2020, 9 pgs.

Fraunhofer-Gesellschaft. Virtual tests for autonomous driving systems. Phys.erg [online], Apr. 1, 2019, https://phys.org/news/2019-04-virtual-autonomous.html, pp. 1-3.

Werner Scheiblhofer et al., "Low-cost Target Simulator for End-of-Line Tests of 24-GHz Radar Sensors", Warsaw Univ. of Technology, 2018, pp. 531-534.

English translation of CN204101724U, 4 pgs.

"Radar Scene Emulator", Keysight Technologies, Jun. 20, 2022, pp. 1-12.

* cited by examiner

SEPARATING RECEIVE AND TRANSMIT ANTENNAS OF A RADAR TEST SYSTEM

BACKGROUND

Advanced driver-assistance systems (ADASs) and autonomous driving systems for vehicles rely on detection and ranging systems that use detection and ranging electromagnetic signals, including millimeter wave radar signals, for example. The radar signals are used to warn of forward collisions and backward collisions, to implement adaptive cruise control and autonomous parking, for example, and ultimately to perform autonomous driving on streets and highways. ADASs are promising due to low cost, and the ability to operate at night or in inclement weather conditions (e.g., fog, rain, snow, dust).

Millimeter waves result from oscillations at frequencies in the frequency spectrum between 30 gigahertz (GHz) and 300 gigahertz. Millimeter wave (mmWave) automotive radar is a key technology for existing advanced driver-assistance systems (ADAS) and for planned autonomous driving systems. In addition to providing better angular resolution than comparatively longer wavelength (lower frequency) systems, adaptation of millimeter wave automotive radar has lowered costs to the point that millimeter wave automotive radar can now be deployed in large volumes. As a result, millimeter wave automotive radars are now widely used for long range, middle range and short range environment sensing in advanced driver-assistance systems. Additionally, millimeter wave automotive radars are likely to be widely used in autonomous driving systems currently being developed.

Actual driving environments in which automotive radars may be deployed can vary greatly and many such driving environments may be complex. For example, actual driving environments may contain numerous objects, and some objects encountered in actual driving environments have complicated reflection and diffraction characteristics that affect echo signals. The immediate consequences of incorrectly sensing and/or interpreting echo signals may be that false warnings or improper reactions are triggered or warnings or reactions that should be triggered are not, which in turn can lead to accidents.

Consequently, auto manufacturers and the automotive radar manufacturers are eager to electronically emulate driving conditions to provide automotive radar systems with optimally accurate performance.

Single-target radar emulators are known. Emulating an actual driving scenario, however, necessitates emulating multiple targets. This can be done through placement of multiple re-illuminators, each of which representing a target at a certain distance from a device under test (DUT). Unfortunately, certain known re-illuminators are susceptible to error caused by "leakage" of signals between the transmit part of the re-illuminator and the receive part of the re-illuminator. Ultimately, these leaked signals can cause erroneous ("ghost") signals at the DUT, and ultimately can compromise the accuracy of the tested DUT.

What is needed, therefore, is a re-illuminator for emulating a target encountered by a radar system that overcomes at least the drawbacks of the known radar emulators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, the present teachings relate to a miniature radar target simulator (MRTS) and a system comprising a plurality of MRTS's useful in a system for emulating echo signals for a radar DUT with reduced interference. To this end, radar test systems of the present teachings desirably generate the intended (emulated) radar targets and reduce unwanted ("ghost") signals from "ghost targets," and errant/ambient electromagnetic radiation that reduces the performance and reliability of known re-illuminators and systems including same. These ghost targets can come from extra RF signals from a number of sources, including leakage currents between transmit and receive antennae and reflections off hardware that makes up the MRTS. As such, there are many possible paths in the circuit of the MRTS for the incoming signal to 'leak' from the input circuitry into the output. This is because each component will have some non-zero coupling to other parts of the system. This coupling can be through the air, through the substrate or through the electronic devices themselves. The reduced interference realized by the MRTS's and systems of the present teachings is realized by reducing crosstalk and leakage between a transmit antenna and a receive antenna of the MRTS. Beneficially, this reduction in crosstalk reduces the incidence of erroneous simulations (e.g., reduced "ghost" targets) that can ultimately impact the accuracy of the system testing the radar DUT.

According to a representative embodiment, an MRTS adapted to receive electromagnetic waves and transmit response signals. The MRTS comprises: a receive antenna; a variable gain amplifier (VGA); an in-phase-quadrature (IQ) mixer; a variable attenuator; a transmit antenna; and an isolation structure adapted to reduce crosstalk between the receive antenna and the transmit antenna.

According to another representative embodiment, a system for receiving a radar signal transmitted by a radar DUT, and transmitting an emulated echo signal reflected from an emulated target to the radar DUT in response to the radar signal is disclosed. The system comprises: a plurality of miniature radar target simulator (MRTS's), each of the MRTS's comprising: a receive antenna; a variable gain amplifier (VGA); an in-phase-quadrature (IQ) mixer; a variable attenuator; a transmit antenna; and an isolation structure adapted to reduce crosstalk between the receive antenna and the transmit antenna.

Figure 1:
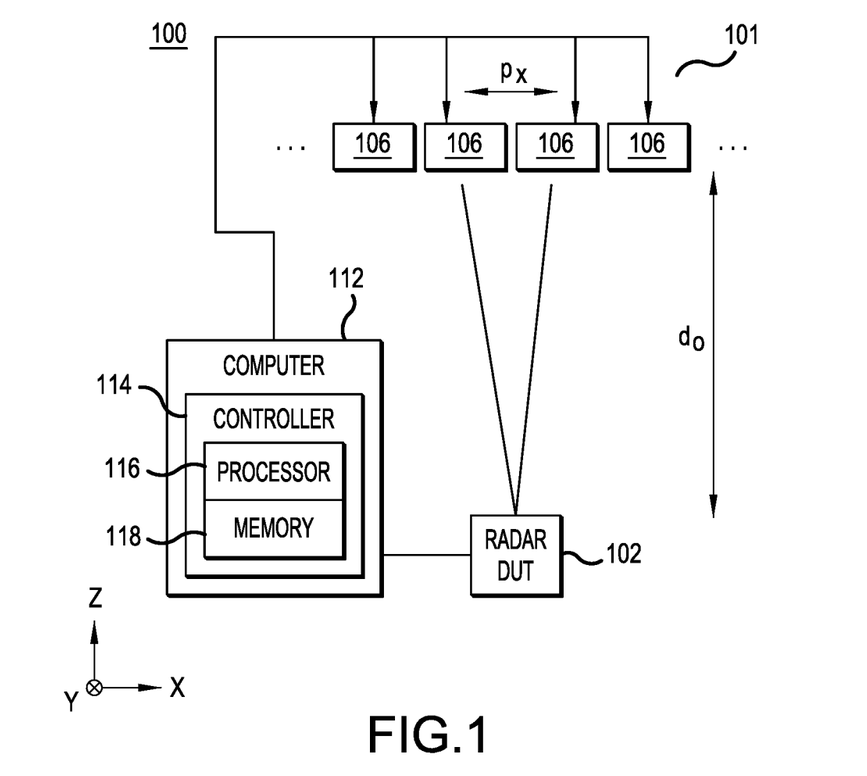
FIG. 1 is a simplified block diagram showing a system for emulating echo signals for a radar device under test (DUT) with reduced interference from reflection, according to a representative embodiment.

FIG. 1 is a simplified block diagram showing a system for emulating echo signals for a radar DUT with reduced interference (e.g., elimination of ghost targets), according to a representative embodiment.

FIG. 1 is a simplified block diagrams showing system 100 for testing vehicular radar in accordance with a representative embodiment. As will be appreciated by one of ordinary skill in the art having the benefit of the present disclosure, one likely vehicular radar is an automobile radar that is used in various capacities in current and emerging automobile applications. However, it is emphasized that the presently described system 100 for testing vehicular radar is not limited to automobile radar systems, and can be applied to other types of vehicles including busses, motorcycles, motorized bicycles (e.g., scooters), and other vehicles that could employ a vehicular radar system.

In accordance with a representative embodiment, the system 100 is arranged to test a radar device under test (DUT) 102. The system 100 comprises a re-illuminator 101, which comprises an array of MRTS's 106. The array of MRTS's 106 in FIG. 1 is two-dimensional extending in the x-y direction according to the coordinate system of FIG. 1. Moreover, the array of MRTS's 106 of re-illuminator 101 can be comparatively flat, curved in an arc along as a single row array, or curved in two dimensions in an array of multiple columns and rows.

The MRTS's 106 of the array have a lateral spacing $p_x$ and vertical spacing $p_y$ as shown in FIG. 1.

Figure 2:
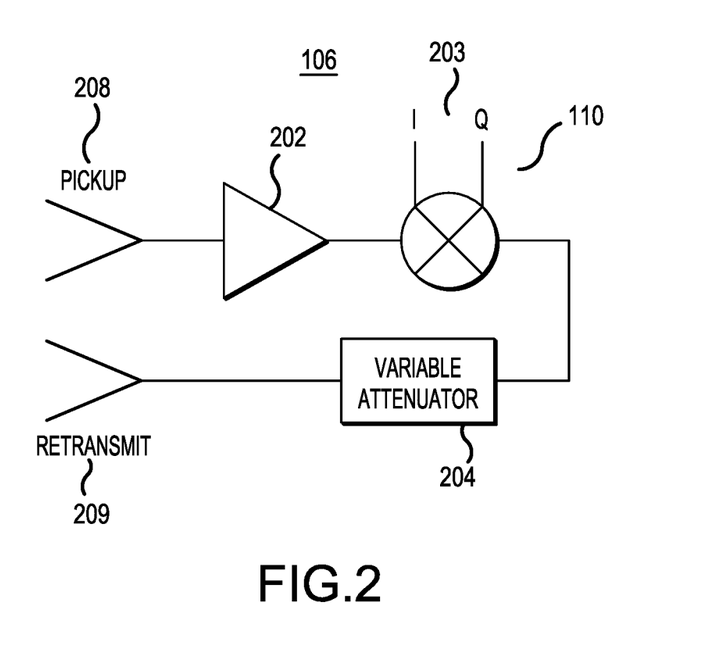
FIG. 2 is a simplified block diagram of a patch array antenna of a radar target simulator (RTS) in a system for emulating echo signals for a radar DUT, according to a representative embodiment.

As described below in connection with FIG. 2, each of the MRTS's 106 comprises a transmit antenna (not shown in FIG. 1) and a receive antenna (not shown in FIG. 1). As described more fully herein, there is one MRTS 106 for each emulated target.

The system 100 also comprises a computer 112. The computer 112 illustratively comprises a controller 114 described herein. The controller 114 described herein may include a combination a processor 116 and a memory 118 that stores instructions. The processor 116 executes the instructions in order to implement processes described herein. To this end, in addition to controlling the function of the radar DUT 102, in accordance with a representative embodiment, computer 112 is adapted to control re-illuminator 101. As described more fully below, instructions stored in memory 118 are executed by the processor 116 to alter the signal strength (and thus power) of selected MRTS's 106 by adjusting drive signals from the computer 112 to the MRTS's 106, with weaker drive signals providing comparatively weaker responsive emulation signals, and stronger drive signals providing comparatively stronger responsive emulation signals in accordance with the present teachings. Notably, however, in certain embodiments, comparatively high magnitude drive signals to the I-Q mixers of the MRTS's 106, and emulation strength (and thereby emulated RCS) is adjusted by the VGA. This approach is preferable to lowering the magnitude of the desired stimulus signal by lowering the drive signals to the I-Q mixer, which strengthens the carrier frequency (as noted below), resulting in an undesirable ghost signal.

The controller 114 may be housed within or linked to a workstation such as the computer 112 or another assembly of one or more computing devices, a display/monitor, and one or more input devices (e.g., a keyboard, joysticks and mouse) in the form of a standalone computing system, a client computer of a server system, a desktop or a tablet. The term "controller" broadly encompasses all structural configurations, as understood in the art of the present disclosure and as exemplarily described in the present disclosure, of an application specific main board or an application specific integrated circuit for controlling an application of various principles as described in the present disclosure. The structural configuration of the controller may include, but is not limited to, processor(s), computer-usable/computer readable storage medium(s), an operating system, application module(s), peripheral device controller(s), slot(s) and port(s).

Additionally, although the computer 112 shows components networked together, two such components may be integrated into a single system. For example, the computer 112 may be integrated with a display (not shown) and/or with the system 100. That is, in some embodiments, functionality attributed to the computer 112 may be implemented by (e.g., performed by) the system 100. On the other hand, the networked components of the computer 112 may also be spatially distributed such as by being distributed in different rooms or different buildings, in which case the networked components may be connected via data connections. In still another embodiment, one or more of the components of the computer 112 is not connected to the other components via a data connection, and instead is provided with input or output manually such as by a memory stick or other form of memory. In yet another embodiment, functionality described herein may be performed based on functionality of the elements of the computer 112 but outside the system 100.

While the various components of the system 100 are described in greater detail in connection with representative embodiments below, a brief description of the function of the system 100 is presented currently.

In operation, with reference to FIG. 1, the radar DUT 102 emits signals (illustratively mm wave signals) that are incident on the array of MRTS's 106. As described more fully herein, the signals from the radar DUT 102 are selectively reflected with a power level adapted to emulate the distance, in both azimuth (±x-direction in the coordinate system of FIG. 1) and the elevation (±y direction in the coordinate system of FIG. 1) between each MRTS 106 and the radar DUT 102. Notably, the respective focal points (alternatively foci) at each one of the receive antennae (not shown) represents a target that is emulated by the system 100.

The re-illuminated signals from MRTS's 106 that receive signals from the radar DUT 102 are selectively altered by the MRTS's 106 and transmitted back to the radar DUT 102. As described more fully below, the re-illuminated signals from the particular MRTS's 106 of the re-illuminator 101 are received at the radar DUT 102 as emulated reflected signals from targets. The computer 112 receives the signals from the radar DUT 102 for further analysis of the accuracy of the radar DUT 102. FIG. 2 is simplified circuit diagram of the MRTS 106 of FIG. 1, in accordance with a representative embodiment. Aspects of the MRTS 106 described in connection with the representative embodiments may be common to the MRTS's 106 and delay electronics described above, although they may not be repeated. Furthermore, various aspects of the MRTS's 106 (sometimes referred to as MRD's, CMT's and pixels) may be similar to those described in commonly-owned U.S. patent application Ser. No. 17/157,160 filed on Jan. 25, 2021. The entire disclosure of U.S. patent application Ser. No. 17/157,160 is specifically incorporated herein by reference. Notably, some aspects of the MRTS 106 may also be similar to those described in commonly-owned U.S. Provisional Application No. 62/912,442 filed on Oct. 9, 2019; commonly-owned U.S. patent application Ser. No. 16/867,804 filed on May 20, 2020; commonly owned U.S. Provisional Application No. 63/046,301 filed on Jun. 30, 2020; and commonly-owned International Application No. PCU/US21/15483 filed on Jan. 29, 2021. The entire disclosures of U.S. Provisional Application No. 62/912,442; U.S. patent application Ser. No. 16/867,804; U.S. Provisional Application No. 63/046,301; and commonly-owned International Application No. PCU/US21/15483 are specifically incorporated herein by reference. As will become clearer as the present description continues, aspects of the above-incorporated patent applications that relate to the use and function of a circulator, and a single antenna (for both reception and transmission of signals) in an MRTS are not germane to the present teachings.

The MRTS 106 comprises an amplifier 202, which is illustratively a variable-gain amplifier (VGA) connected to the output of a mixer 203, although connecting the amplifier 202 to the input of the mixer 203 is also contemplated. The mixer 203 is an in-phase (I)-quadrature (Q) mixer (IQ mixer), or I-Q modulator, which for reasons described below, is beneficially a single-sideband IQ mixer, with standard 90° phasing of the RF signal, resulting in an output of either the upper sideband (USB) or the lower sideband (LSB), rejecting the LSB or USB, respectively. Alternatively, the mixer 203 may be adapted for binary phase modulation (BPM), quaternary phase modulation (QPM), 8-phase modulation, 16-QAM, and the like. As discussed below, the modulation is selected to provide the desired degree of approximation of the difference phase symbols. Notably, approximation of the amplitude can be carried out by the mixer 203 using techniques within the purview of the ordinarily skilled artisan.

The amplifier 202 of representative embodiments provides two illustrative beneficial functions. I-Q mixers are known to suffer conversion loss, so in order to emulate targets having comparatively large radar cross sections (RCS's), amplification is required. Moreover, the VGA is useful to selectively vary the RCS. Simply reducing the strength of the I and Q drives is undesirable because this passes along a strong unshifted carrier frequency signal which could result in an undesired ghost target.

The output of the mixer 203 is provided to a variable attenuator 204, which selectively alters the output signal provided from the mixer 203 to provide a desired return signal to the radar DUT 102. Specifically, the attenuation of the signal from the mixer 203 by the variable attenuator 204 beneficially provides a desired emulated radar cross section (RCS) of the target. Notably, the variable attenuator 204 is optional, and may be included to provide additional attenuation necessary beyond the contribution of the amplifier 202 to emulate the RCS as desired.

As alluded to above, the amplifier 202 and the variable attenuator 204 are connected to the computer 112. Based on instructions in the memory 118, the processor 116 executes control signals to be provided by the computer 112 to the variable attenuator 204, to enable a desired level of emulation of the re-illuminated signal received from the radar DUT 102 at a reception antenna 208 and returned to the radar DUT 102 from the reillumination antenna 209.

In certain representative embodiments, the reception antenna 208 and the reillumination antenna 209 are patch antennae or patch antennae arrays selected for the wavelength of signals received from and returned to the radar DUT 102. The reception antenna 208 may have a variable gain and may be coupled to a beam-shaping element, such as a lens to tailor a degree of freedom of an angle of arrival (AoA) from the radar DUT 102. The horn or similar antenna are not essential for the reception antenna 208 and the reillumination antenna 209, and other types of antennae, such as printed dipole antennae and cavity-backed slot antennae, may be incorporated without departing from the scope of the present teachings.

Notably, power is used to emulate consistent radar cross-section (RCS). The RCS can be stored in look-up in tables in memory 118, for example. To this end, for a given range r, it is known that the return signal is proportional to RCS and falls as $1/r^4$. A vehicle is typically quoted as being 10 dBsm, which is radar speak for measuring area, meaning 10 dB relative to a square meter (s.m.), or in plain English, 10 square meters. Many objects have been tabulated (people, bicyclists, buildings, etc.), and those that have not can be calculated these days by ray tracing techniques. By the present teachings, emphasis is placed on providing a return signal strength to the radar DUT 102 that is commensurate with the distance r (obeying the well-known $1/r^4$ radar decay law) and the accepted value of RCS for the particular object. In accordance with a representative embodiment, the signal strength (and thus power) is adjusted by adjusting the strength of the I/Q drive signals from the computer 112 to the MRTS's 106 of the various embodiments, with a weaker I/Q drive signal providing a comparatively weaker emulation signal. Notably, in certain representative embodiments, the computer 112 precomputes the consistent return signal provided to the single point of focus at the radar DUT 102, and the controller 114 then adjusts the strength of the I and Q drives to achieve this SSB strength. Alternatively, and beneficially, the gain of amplifier 202, or the attenuation by the variable attenuator 204, or both can be adjusted by action of the controller 114 to control return SSB strength.

Figure 3:
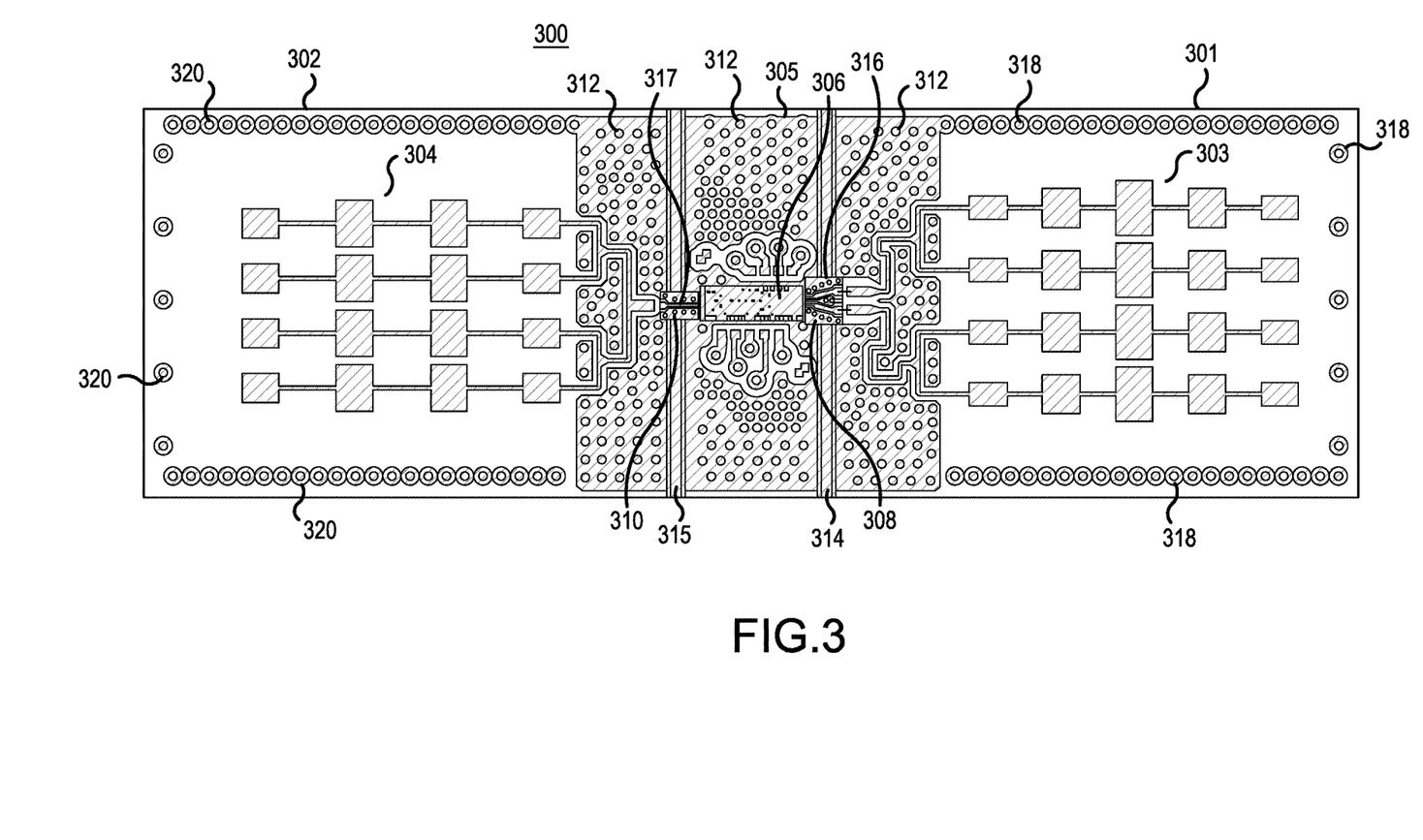
FIG. 3 is a top view of a circuit board included in an MRTS according to a representative embodiment.

FIG. 3 is a top view of a circuit board 300 included in an MRTS according to a representative embodiment. As described more fully below, the circuit board 300 is a multilayer (multi-level) printed circuit board with selectively disposed signal transmission lines and ground planes/connections.

The circuit board 300 comprises a transmit side 301, a receive side 302, and an IC section 305. A transmit patch antenna array 303 is disposed over an upper layer of the circuit board 300 on the transmit side 301. Similarly, a receive patch antenna array 304 is disposed over an upper layer of the circuit board 300 on the receive side 302. As alluded to above, in accordance with a representative embodiment, the transmit antenna comprises the patch antenna array 303, and the receive antenna comprises the receive patch antenna array 304.

The circuit board 300 comprises IC 306 comprising amplifier 202 (not shown in FIG. 3), mixer 203 (not shown in FIG. 3), variable attenuator 204 (not shown in FIG. 3), and other electronic components (not shown in FIG. 3) used in MRTS 106 in accordance with the present teachings. The IC 306 includes circuit connections needed to effect the reception of signals from the receive side 302 and to provide signals for re-transmission by the transmit side.

The IC is connected to the transmit side 301 by a first connection 308, and to the receive side 302 by a second connection 310. The first connection 308 illustratively provides a differential output to the transmit patch antenna array 303, whereas the second connection provides a single input connection to the IC from the receive patch antenna array 304. As described more fully below, the first and second connections 308, 310 may comprise of thin film circuits comprising signal transmission lines disposed over ground planes (see FIG. 4C for example, below). Connections between the IC and the transmit patch antenna array 303, and the IC and the receive patch antenna array 304 can be made by one of a number of known techniques, including a combination of thin film circuits and wire bonds (see FIG. 4C, for example, below). As will be appreciated when the present description continues, the connections between the IC 306 and the transmit patch antenna array 303, and between the IC 306 and the receive patch antenna array 304 (e.g., first and second connections 308,310) beneficially enable a physical separation of the transmit side 301 and the receive side 302, as well as to provide space for vias and moats (discussed below), which are electrically connected to ground. Alternatively, the use of only wire bonds or other known connection techniques that provide the noted separation and space to provide connections between the IC 306 and the transmit patch antenna array 303, and the IC and the receive patch antenna array 304 are also contemplated.

The circuit board 300 also comprises an isolation structure adapted to reduce crosstalk between the receive antenna (comprising receive patch antenna array 304) and the transmit antenna (comprising transmit patch antenna array 303), and thus between the receive side 302 and the transmit side 301. The isolation structure comprises a plurality of vias 312; a first moat 314 disposed between the IC 306 and the transmit patch antenna array 303; and a second moat 315 disposed between the IC 306 and the receive patch antenna array 304. In addition, when the first connection 308 and the second connection 310 comprising thin film circuits, first vias 316 and second vias 317 are provided around the transmission lines that transmit the signals between the IC and the transmit side 301, and between the IC and the receive side 302. Finally, transmit side vias 318 and receive side vias 320 are disposed around the transmit antenna and the receive antenna. Transmit side vias 318 and receive side vias 320 are also connected to ground, and foster isolation of the transmit antenna and the receive antenna from ambient and other electromagnetic radiation that could interfere with the reception and transmission of signals by the MRTS.

The plurality of vias 312 on the transmit side 301 form a transmit via field; and the plurality of vias 312 on the receive side 302 form a receive via field. The plurality of vias 312, the first and second moats 314,315, and the first and second vias 316, 317 are connected electrically to ground. As described more fully below, the plurality of vias 312, the first and second moats 314, 315, and the first and second vias 316, 317 reduce leakage current between the transmit side 301 and the receive side 302, as well as reduce transmission of errant signals from the air or ambient from being transmitted through the circuit board. The reduction in undesired signals in an MRTS comprising circuit board 300 from various sources provides significant improvement in isolation between the transmit and receive sides 301, 302 when compared to known re-illuminators, such as those using a circulator and a single antenna for transmit and reception. This is particularly the case at frequencies often used for automotive radar (e.g., 77 GHz-100 GHz).

Figure 4A:
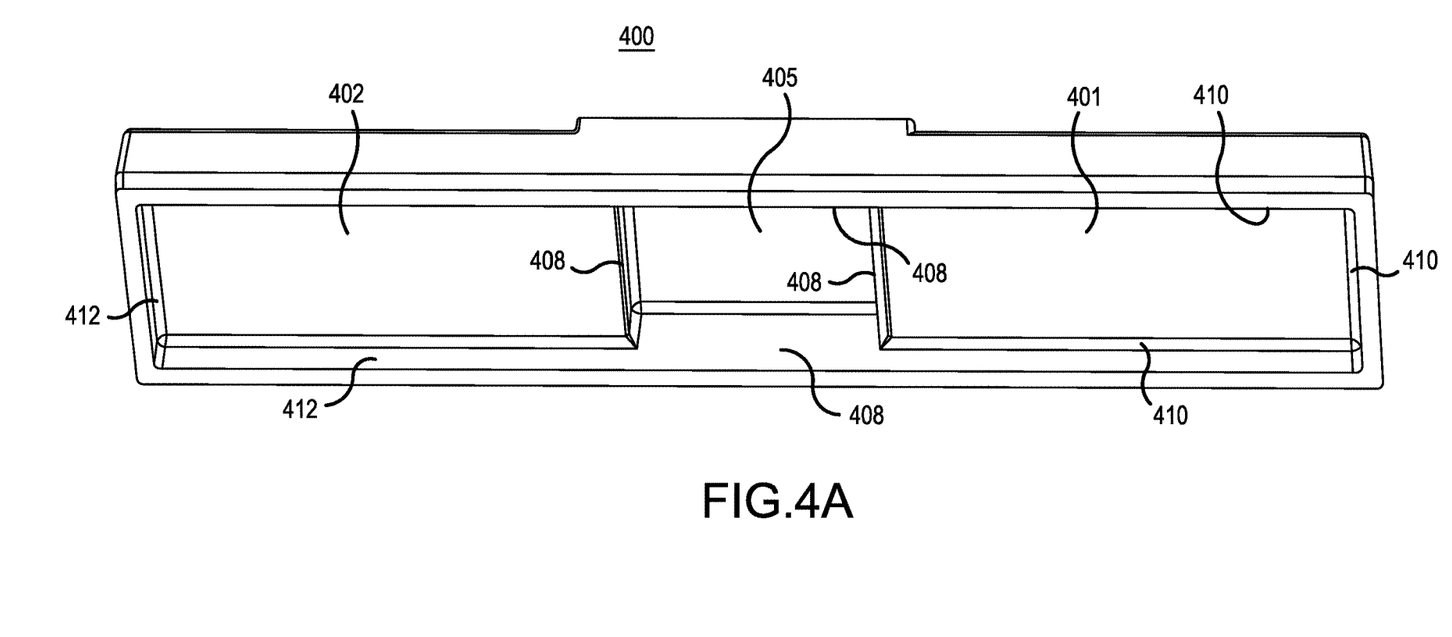
FIG. 4A is a perspective view of an underside of a lid of an MRTS according to a representative embodiment.

FIG. 4A is a perspective view of a lid 400 of an MRTS (not shown in FIG. 4) according to a representative embodiment. Certain aspects of the representative embodiments described above in connection with FIGS. 1-3 may be germane to the description of the lid, and may not be repeated in order to avoid obscuring the presently described representative embodiments.

The lid 400 comprises a transmit compartment 401, a receive compartment 402, and an IC compartment 405 disposed between the transmit compartment 401 and the receive compartment 402. As shown, in the depicted representative embodiment, the IC compartment 405 is deeper (more recessed) than either the transmit compartment 401 or the receive compartment 402, which illustratively have the same depth.

The lid 400 comprises first walls 408 between the transmit compartment 401 and the IC compartment 405, and between the receive compartment 402 and the IC compartment 405. The lid 400 comprises second walls 410 around the perimeter of the transmit compartment 401 and third walls 412 around the perimeter of the receive compartment 402. As described more fully below, the first walls 408 beneficially provide surfaces for refraction and reflection of electromagnetic waves/signals within an MRTS comprising lid 400 to foster isolation of the transmit side and receive side of MRTSs of the representative embodiments. The second and third walls 410, 412 result in refraction and reflection of electromagnetic waves to reduce crosstalk between neighboring MRTS's (e.g., MRTS's 106 of FIG. 1).

In accordance with another representative embodiment described more fully below, an electromagnetic absorbing material may be disposed in the IC compartment 405 to reduce crosstalk between the transmit antenna (disposed beneath the transmit compartment 401) and the receive antenna (disposed beneath the receive compartment 402), as well as to prevent other sources of radiation (e.g., from the ambient) from being transmitted to the transmit and receive antennae. Notably, the electromagnetic absorbing material is optional. If the electromagnetic absorbing material is not provided, first walls 408 in the IC compartment 405 provide surfaces for reflection and refraction of electromagnetic waves to aid the reduction of crosstalk within the MRTS comprising lid 400. However, regardless of whether the electromagnetic absorbing material is provided, the IC compartment 405 is provided, and first walls 408 beneficially provide surfaces for reflection and refraction of unwanted radiation within the MRTS comprising lid 400. By contrast, if the IC compartment 405 were not provided, first walls would not exist, and unwanted radiation would reflect off the bottom (inside top surface) of the lid 400, and radiate down to the IC 427, thin film connections, antennae, and other components of the MRTS. These reflections/refractions could increase unwanted interference/crosstalk within the MRTS and have an undesired impact on performance. In accordance with the present teachings first walls 408 of the IC compartment 405 will result in reflection and refraction of electromagnetic signals within the MRTS comprising lid 400 at different angles of incidence and provide more isolation between the antennae of the transmit compartment 401 and the antennae of the receive compartment 402, and accordingly improved TX/RX isolation within the MRTS package comprising lid 400. The lid 400 is adapted to be connected to a substrate (not shown in FIG. 4A) or a base (not shown in FIG. 4A) comprising circuit board 300 (not shown in FIG. 4A) and the IC (not shown in FIG. 4A). The lid 400 is bonded to the substrate, and provides a hermetic seal to protect the various components of the MRTS disposed in the transmit compartment 401, the receive compartment 402 and the IC compartment 405.

In accordance with representative embodiments, the materials contemplated for the lid 400 beneficially have a comparatively low loss tangent at frequencies of interest and a comparatively low dielectric constant (e.g., $\varepsilon_r$<4). Similarly, the thickness of the lid 400 is selected to be substantially equal to one-half of the dielectric wavelength ($\lambda_r/2$) of the transmit and receive signals, where the dielectric wavelength is the free-space wavelength divided by the square-root of the dielectric constant (i.e., $\lambda_r=\lambda/\sqrt{\varepsilon_r}$). Beneficially, the thickness of the lid 400 is beneficially selected to preserve the radiation properties (gain/direction) of the transmit antenna and the receive antenna as the signals radiate through the lid 400. The half dielectric wavelength provides substantially the maximum signal propagation through the dielectric of the lid 400. Notably, there is a dielectric constant ($\varepsilon_r$) barrier between air $\varepsilon_r$=1 and the lid (e.g., $\varepsilon_r$=3) interface that the signals between the DUT and the MRTSs. The greater the difference between the dielectric constant of air and the lid (e.g., 1:10 vs 1:3) the greater the degree of reflections at the lid/air interface.

Figure 4B:
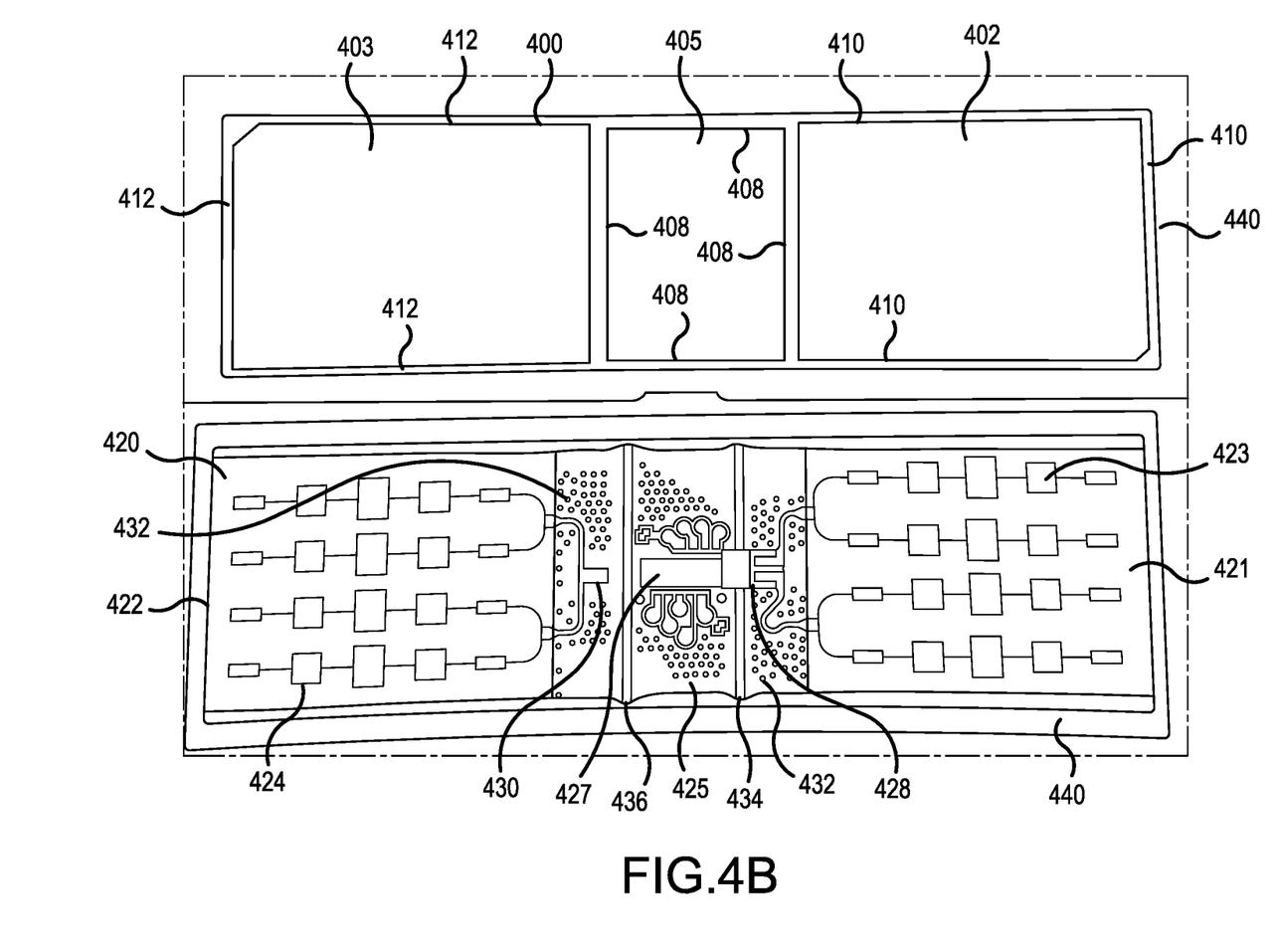
FIG. 4B is a perspective view of the lid shown in FIG. 4A disposed adjacent to a base over which a circuit board is disposed, according to a representative embodiment.

FIG. 4B is a perspective view of the lid 400 shown in FIG. 4A disposed adjacent to a base 440 over which a circuit board 420 is disposed, according to a representative embodiment. Certain aspects of the representative embodiments described above in connection with FIGS. 1-4A may be germane to the description of the various aspects of the lid, the base 440, and the circuit board may not be repeated in order to avoid obscuring the presently described representative embodiments.

The circuit board 420 comprises a transmit side 421, a receive side 422, and an IC section 425. A transmit patch antenna array 423 is disposed over an upper layer of the circuit board 420 on the transmit side 421. Similarly, a receive patch antenna array 424 is disposed over an upper layer of the circuit board 420 on the receive side 4222. As noted above, in accordance with a representative embodiment, the transmit antenna comprises the patch antenna array 423, and the receive antenna comprises the receive patch antenna array 424.

As alluded to above, an IC 427 is disposed on a section of the circuit board 420 adapted to receive IC 427 comprising the amplifier, the mixer, the variable attenuator, and other electronic components used in MRTS 106 in accordance with the present teachings. The section includes circuit connections needed to effect the reception of signals from the receive side 422 and to provide signals for re-transmission by the transmit side 421.

The IC 427 is connected to the transmit side 421 by a first connection 428, and to the receive side 422 by a second connection 430. The first connection 428 illustratively provides a differential output to the transmit patch antenna array 423, whereas the second connection 430 provides a single input connection to the IC 427 from the receive patch antenna array 424. As noted above and as described more fully below, the first and second connections 428, 430 may comprise thin film circuits comprising signal transmission lines having signal lines disposed over ground planes (see FIG. 5, for example, below). As noted above, connections between the IC 427 and the transmit patch antenna array 423, and the IC 427 and the receive patch antenna array 424 can be made by one of a number of known techniques, including wire bonds in conjunction with thin film connections (see FIG. 4C, for example, below), or other suitable electrical connections noted above. Again, the selected electrical connections beneficially provide suitable electrical connections, separation of the transmit and receive sides, and space for vias and moats as noted above.

The circuit board 420 also comprises an isolation structure adapted to reduce crosstalk between the receive antenna (comprising receive patch antenna array 424) and the transmit antenna (comprising transmit patch antenna array 423), and thus between the receive side 422 and the transmit side 4211. The isolation structure comprises a plurality of vias 432; a first moat 434 disposed between a section (not visible in FIG. 4B) over which the IC 427 is disposed and the transmit patch antenna array 423; and a second moat 436 disposed between the section (and thus the IC 427) and the receive patch antenna array 424. In addition, when the first connection 308 and the second connection 310 comprising thin film circuits, first vias ((e.g., first vias 316) (not shown in FIG. 4B)) and second vias (e.g., second vias 317) (not shown in FIG. 4B)) are provided around the transmission lines that transmit the signals between the IC 427 and the transmit side 421, and between the IC 427 and the receive side 4222. Finally, transmit side vias (e.g., 318) (not shown in FIG. 4B)) and receive side vias ((e.g., 320) not shown in FIG. 4B)) may be disposed around the transmit antenna and the receive antenna. Transmit side vias and receive side vias are also connected to ground, and foster isolation of the transmit antenna and the receive antenna from ambient and other electromagnetic radiation that could interfere with the reception and transmission of signals by the MRTS.

The plurality of vias 432 on the transmit side 420 form a transmit side via field; and the plurality of vias 432 on the receive side 422 form a receive side via field. The plurality of vias 432, the first and second moats 434,436, and the first and second vias (e.g., 314, 316 not shown in FIG. 4B) are connected electrically to ground. The plurality of vias 432, the first and second moats 434,436, and the first and second vias reduce leakage current between the transmit side 421 and the receive side 422, as well as reduce transmission of errant signals from the air or ambient from being transmitted through the circuit board. The reduction in undesired signals in an MRTS comprising circuit board 420 from various sources provides significant improvement in isolation between the transmit and receive sides 421, 422 when compared to known re-illuminators, such as those using a circulator and a single antenna for transmit and reception. This is particularly the case at frequencies often used for automotive radar (e.g., 77 GHz-100 GHz). Notably, at these comparatively high frequencies, certain known re-illuminators that include a circulator and a single antenna for reception and transmission provide isolation of approximately 20 dB between the reception and transmission components, and at a comparatively high cost. By contrast, at these comparatively high frequencies, MRTS's of the presently described representative embodiment provide isolation between the transmit side 421 and the receive side 422 of approximately 45 dB. Moreover, and as noted above the first, second and third walls 408, 410 and 412 beneficially provide surfaces for refraction and reflection of electromagnetic waves/signals to foster isolation of the transmit side 421 and receive side 422 of MRTSs of the representative embodiments.

Figure 4C:
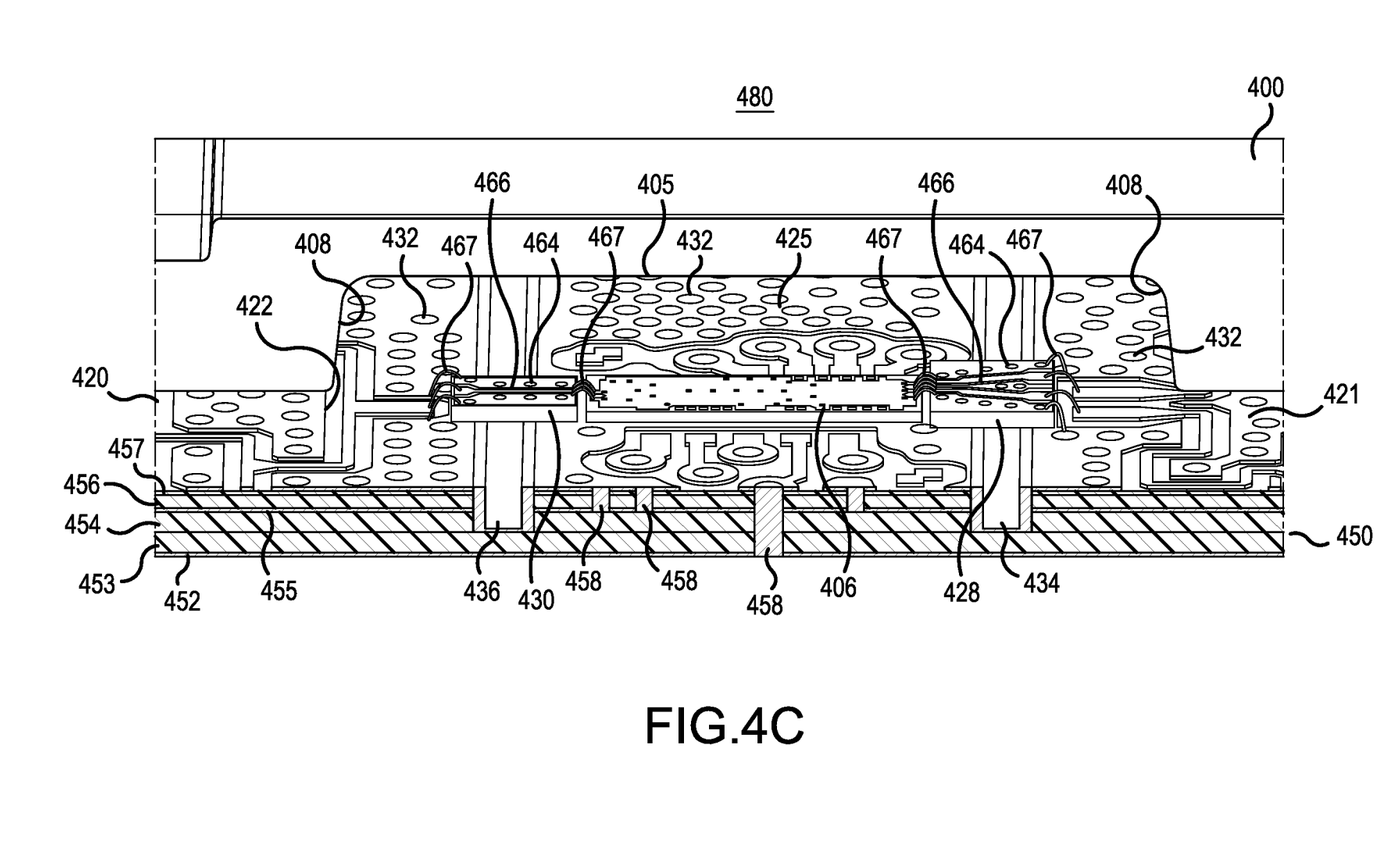
FIG. 4C is a partial cross-sectional view of an MRTS in accordance with a representative embodiment.

FIG. 4C is a partial cross-sectional view of an MRTS 480 in accordance with a representative embodiment. The MRTS 480 is shown in a packaged state with the lid 400 disposed over a multilayer substrate 450, over which a circuit board 420 is disposed, according to a representative embodiment. Certain aspects of the representative embodiments described above in connection with FIGS. 1-4B may be germane to the description of the various aspects of the MRTS 480 may not be repeated in order to avoid obscuring the presently described representative embodiments.

FIG. 4C shows the transmit compartment 401 comprises first walls 408 between the transmit compartment 401 and the IC compartment 405, and between the receive compartment 402 and the IC compartment 405. As noted above, the first walls 408 beneficially provide surfaces for refraction and reflection of electromagnetic waves/signals to foster isolation of the transmit side and receive side of MRTSs of the representative embodiments. Moreover, in accordance with another representative embodiment described more fully below, an electromagnetic absorbing material (not shown in FIG. 4C) may be disposed in the IC compartment 405.

The circuit board 420 comprises the transmit side 421, the receive side 422, and the IC section 425. The transmit patch antenna array 423 (not shown in FIG. 4C) is disposed over an upper layer of the circuit board 420 on the transmit side 421. Similarly, the receive patch antenna array 424 (not shown in FIG. 4C) is disposed over the upper layer of the circuit board 420 on the receive side 422. As noted above, in accordance with a representative embodiment, the transmit antenna comprises the patch antenna array 423 (not shown in FIG. 4C), and the receive antenna comprises the receive patch antenna array 424 (not shown in FIG. 4C).

As alluded to above, IC 427 is disposed on section adapted to receive IC 427 comprising the amplifier, the mixer, the variable attenuator, and other electronic components used in MRTS 480 in accordance with the present teachings. The section includes circuit connections needed to effect the reception of signals from the receive side 422 and to provide signals for re-transmission by the transmit side 421.

The IC 427 is connected to the transmit side 421 by the first connection 428, and to the receive side 422 by the second connection 430. The first connection 428 illustratively provides a differential output to the transmit patch antenna array 423, whereas the second connection 430 provides a single input connection to the IC 427 from the receive patch antenna array 424. As noted above, the first and second connections 428, 430 may comprise thin film circuits comprising signal transmission lines having signal lines 466 disposed over ground planes (on underneath side of the thin film components) that form the first and second connections 428, 430, which make electrical contact to ground through contact to the first and second moats 434, 436, respectively. Moreover, vias 464, which are connected electrically to ground (e.g., connections to the first and second moats 434, 436) may be provided in the first and second connections 428, 430. Vias 464 beneficially further improve isolation of the transmit patch antenna array 423 and the receive patch antenna array 424 from electromagnetic interference from receive side 422 and the transmit side 421, respectively, as well as from electromagnetic interference from other sources (e.g., current leakage caused by errant and ambient electromagnetic radiation).

In addition, wire bonds 467 may be used to effect connections between the transmit and receive patch antenna arrays 423, 424 and the IC 427 (not shown in FIG. 4C) via connections to the section over which the IC 427 is disposed. Notably, the first and second connections 428, 430 may be foregone in lieu of just wirebond connections. Alternatively, connections may be made the transmit and receive patch antenna arrays 423, 424 and the IC 427 via only the first and second connections 428, 430.

The MRTS 480 further comprises an isolation structure comprising the plurality of vias 432; vias 464; and first moat 434 and second moat 436. Notably, like vias 312 described above, the plurality of vias 432 beneficially reduce transmission of signals between the transmit and receive patch antenna array 423, 424, and from ambient and other electromagnetic radiation that could interfere with the reception and transmission of signals by the MRTS 480.

The multilayer substrate 450 is a multi-layer circuit board is a known structure by those of ordinary skill in the radar arts. Like the lid 400 described above, the multi-layer substrate beneficially provides a low-loss tangent at the frequencies of interest, and a comparatively low dielectric constant. The multilayer substrate 450 comprises a first dielectric layer 453 disposed over a first electrically conductive layer 452; a second dielectric layer 454 disposed over first dielectric layer 453; a second electrically conductive layer 455 disposed over the second dielectric layer 454; and a third electrically conductive layer 457 disposed over a fourth dielectric layer 456.

Furthermore, the multilayer substrate 450 comprises interlayer vias 458, which are adapted to provide selective electrical connections between signal lines and ground planes/connections in the various layers of the multi-layer substrate, as would be known by one of ordinary skill in the art. Notably, through connections such as interlayer vias 458, the first, second and third electrically conductive layers 452,455 and 457 may provide signal transmission lines and ground planes to effect the transmission of signals to/from the IC 427, and the transmit and receive patch antenna arrays 423, 424. Additionally, the first, second and third electrically conductive layers 452,455 and 457 may be selectively connected to ground to provide paths to ground for the vias 432 and vias 464, for example.

Figure 5:
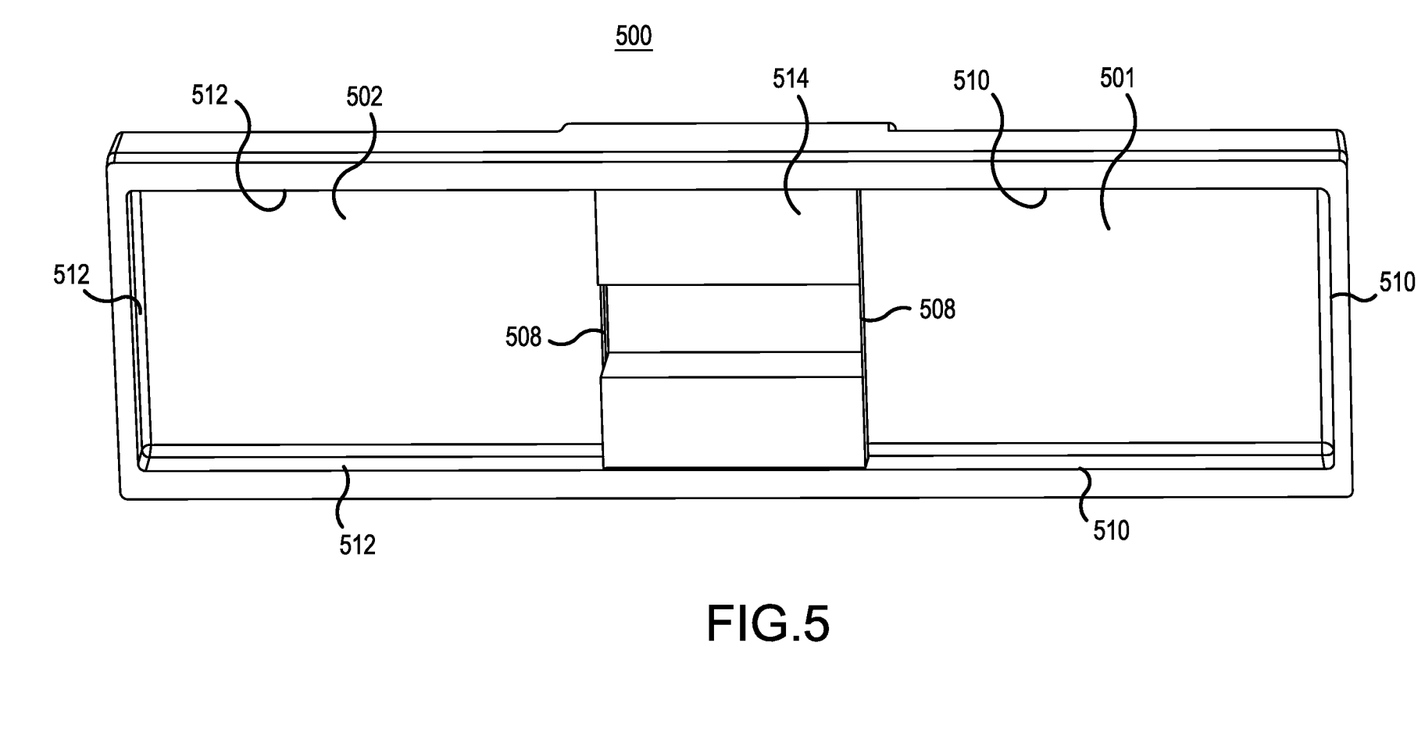
FIG. 5 is a perspective view of an underside of a lid of an MRTS according to a representative embodiment.

FIG. 5 is a perspective view of a lid 500 of an MRTS (not shown in FIG. 5) according to a representative embodiment. Certain aspects of the representative embodiments described above in connection with FIGS. 1-4C may be germane to the description of the lid, and may not be repeated in order to avoid obscuring the presently described representative embodiments. Notably, in accordance with representative embodiments, the lid 500 may be implemented in the same way as lid 400.

The lid 500 comprises a transmit compartment 501, a receive compartment 502, and an IC compartment (not visible in FIG. 5) disposed between the transmit compartment 501 and the receive compartment 502. As shown, in the depicted representative embodiment, the IC compartment is deeper (more recessed) than either the transmit compartment 501 or the receive compartment 502, which illustratively have the same depth.

The lid 500 comprises first walls 508 between the transmit compartment 501 and the IC compartment, and between the receive compartment 502 and the IC compartment. Similarly, the lid 500 comprises second walls 510 around the perimeter of the transmit compartment 501 and third walls 512 around the perimeter of the receive compartment 502. As described above, the first walls 508 beneficially provide surfaces for refraction and reflection of electromagnetic waves/signals within the MRTS comprising lid 500 to foster isolation of the transmit side and receive side of MRTSs of the representative embodiments. The second and third walls 510, 512 result in refraction and reflection of electromagnetic waves to reduce crosstalk between neighboring MRTS's (e.g., MRTS's 106 of FIG. 1). Moreover, in accordance with another representative embodiment described more fully below, an electromagnetic absorbing material 514 is disposed in the IC compartment to reduce crosstalk between the transmit antenna (disposed beneath the transmit compartment 501) and the receive antenna (disposed beneath the receive compartment 502), as well as to prevent other sources of radiation (e.g., from the ambient) from being transmitted to the transmit and receive antennae. In addition to polyiron, a number of known materials are contemplated for use as the electromagnetic absorbing material 514. These include, but are not limited to, Eccosorb® products offered by Cuming Microwave (Avon, MA), similar products by Laird Performance Materials Corporation. In various embodiments, polyiron is selected due to its compactness and compositional integrity with use over time.

The lid 500 is adapted to be connected to a substrate (not shown in FIG. 5) or a base (not shown in FIG. 5) comprising circuit board 300 (not shown in FIG. 5) and the IC (not shown in FIG. 5). The lid 500 is bonded to the substrate, and provides a hermetic seal to protect the various components of the MRTS disposed in the transmit compartment 501, the receive compartment 502 and the IC compartment.

As noted above, at these comparatively high frequencies, certain known re-illuminators that include a circulator and a single antenna for reception and transmission provide isolation of approximately 20 dB between the reception and transmission components, and at a comparatively high cost. By contrast, at these comparatively high frequencies, MRTS's of the presently described representative embodiment provide isolation between the transmit side 421 and the receive side 422 of approximately 60 dB. Moreover, and as noted above the first, second and third walls 508, 510 and 512 beneficially provide surfaces for refraction and reflection of electromagnetic waves/signals to foster isolation of the transmit side 421 and receive side 422 of MRTSs of the representative embodiments.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A miniature radar target simulator (MRTS) adapted to receive electromagnetic waves and to transmit response signals, the MRTS comprising: a receive antenna; a variable gain amplifier (VGA); an in-phase-quadrature (IQ) mixer; a variable attenuator; a transmit antenna; and an isolation structure comprising: a via field comprising a plurality of vias and disposed between an integrated circuit (IC) package and the transmit antenna and/or the receive antenna; and a moat disposed between the IC and the transmit antenna and/or the receive antenna.

2. The MRTS of claim 1, wherein: the VGA, the IQ mixer and the variable attenuator are disposed in the IC package, the via field is a first via field, the plurality of vias is a first plurality of vias, the moat is a first moat, and the first via field, the first plurality of vias and the first moat are disposed between the IC and the transmit antenna; and the isolation structure further comprises: a second via field, a second plurality of vias; and a second moat, wherein the second via field, the second plurality of vias and the second moat are disposed between the IC and the receive antenna.

3. The MRTS of claim 1, wherein each of the first and second pluralities of vias are connected to electrical ground.

4. The MRTS of claim 1, wherein at least some of the first plurality of vias are spaced apart by one-fourth wavelength ($\lambda/4$) to one-half wavelength ($\lambda/2$) of an electromagnetic wave guided in the MRTS.

5. The MRTS of claim 1, wherein the transmit antenna and the receive antenna each comprise a patch antennae array.

6. The MRTS of claim 2, further comprising a lid, which comprises:
a transmit compartment disposed over the transmit antenna;
a receive compartment disposed over the receive antenna; and
an IC compartment disposed over the IC and between the transmit and receive compartments.

7. The MRTS of claim 6, the lid comprising walls between the transmit compartment and the IC compartment and between the receive compartment and the IC compartment, wherein the walls are adapted to refract and reflect electromagnetic waves to reduce crosstalk between the transmit antenna and the receive antenna.

8. The MRTS of claim 6, further comprising an electromagnetic absorbing material disposed in the IC compartment and adapted to reduce crosstalk between the transmit antenna and the receive antenna.

9. The MRTS of claim 8, wherein the electromagnetic absorbing material comprises polyiron.

10. A system for receiving a radar signal transmitted by a radar device under test (DUT), and transmitting an emulated echo signal reflected from an emulated target to the radar DUT in response to the radar signal, the system comprising: a plurality of miniature radar target simulator (MRTS's), each of the MRTS's comprising: a receive antenna; a variable gain amplifier (VGA); an in-phase-quadrature (IQ) mixer; a variable attenuator; a transmit antenna; and an isolation structure comprising: a via field comprising a plurality of vias and disposed between an integrated circuit (IC) package and the transmit antenna and/or the receive antenna; and a moat disposed between the IC and the transmit antenna and/or the receive antenna.

11. The system of claim 10, wherein VGA, IQ mixer and variable attenuator are disposed in the IC package, wherein: the via field is a first via field, the plurality of vias is a first plurality of vias, the moat is a first moat, and the first via field, the first plurality of vias and the first moat are disposed between the IC and the transmit antenna; and each of the isolation structures further comprises: a second via field, a second plurality of vias; and a second moat, wherein the second via field, the second plurality of vias and the second moat are disposed between the IC and the receive antenna.

12. The system of claim 11, wherein each of the first and second pluralities of vias are connected to electrical ground.

13. The MRTS of claim 11, wherein at least some of the first plurality of vias are spaced apart by one-fourth wavelength ($\lambda/4$) to one-half wavelength ($\lambda/2$) of an electromagnetic wave guided in the MRTS.

14. The MRTS of claim 10, wherein the transmit antenna and the receive antenna each comprise a patch antennae array.

15. The MRTS of claim 11, further comprising a lid, which comprises:
a transmit compartment disposed over the transmit antenna;
a receive compartment disposed over the receive antenna; and
an IC compartment disposed over the IC and between the transmit and receive compartments.

16. The MRTS of claim 15, the lid comprising walls between the transmit compartment and the IC compartment and between the receive compartment and the IC compartment, wherein the walls are adapted to refract and reflect electromagnetic waves to reduce crosstalk between the transmit antenna and the receive antenna.

17. The MRTS of claim 15, further comprising an electromagnetic absorbing material disposed in the IC compartment and adapted to reduce crosstalk between the transmit antenna and the receive antenna.

18. The MRTS of claim 17, wherein the electromagnetic absorbing material comprises polyiron.

\* \* \* \* \*